United States Patent [19]
Craford et al.

[11] 3,984,267
[45] Oct. 5, 1976

[54] PROCESS AND APPARATUS FOR DIFFUSION OF SEMICONDUCTOR MATERIALS

[75] Inventors: Magnus George Craford; Paul Michael Garavaglia, both of St. Louis, Mo.

[73] Assignee: Monsanto Company, St. Louis, Mo.

[22] Filed: July 26, 1974

[21] Appl. No.: 492,095

[52] U.S. Cl. .................................. 156/17; 148/186; 148/189; 427/85; 427/93; 427/95; 427/124; 427/240; 427/248 R; 427/248 C; 427/250; 427/252; 427/255; 427/344

[51] Int. Cl.² ........................ H01L 7/44; B05D 5/12

[58] Field of Search ............ 117/201; 148/186, 189; 427/85, 240, 294, 295, 248, 250, 255, 252, 93, 95, 344; 118/49; 156/17

[56] References Cited
UNITED STATES PATENTS

| | | | |
|---|---|---|---|
| 3,127,285 | 3/1964 | Gedgaudos | 427/85 |
| 3,264,707 | 8/1966 | Elie | 148/187 |
| 3,298,879 | 1/1967 | Scott et al. | 148/189 |
| 3,485,685 | 12/1969 | Casey et al. | 148/189 |
| 3,632,434 | 1/1972 | Hutson | 117/101 |
| 3,666,574 | 5/1972 | Tarneja et al. | 117/201 |
| 3,856,588 | 12/1975 | Hashimoto | 117/201 |
| 3,895,137 | 7/1975 | Avramidis | 427/295 |

OTHER PUBLICATIONS

Sittig M., *Doping & Semiconductor Jen. Formation*, Electronics Materials Review, No. 4, (1970), pp. 153–158, 187–189, 191–193, 206–210.

*Primary Examiner*—Michael F. Esposito
*Attorney, Agent, or Firm*—Peter S. Gilster

[57] ABSTRACT

Apparatus for semi-sealed diffusion of semiconductor materials includes a quartz tube with a quartz stopper at one end to facilitate the loading and unloading of semiconductor materials, the other end of the quartz tube having an inlet passage with a quartz stopcock. The stopper includes quartz pressure release valve.

The process involves loading semiconductor material to be diffused into the tube with a source of diffusion. The semiconductor material, e.g., in the form of wafers, is first coated with an oxide layer. The stopper is inserted to seal the tube, the interiors being then purged with an inert gas supplied to the inlet passage which is subsequently closed prior to placing the tube in a furnace to initiate the diffusion process. After diffusion, the ampoule is quenched, the stopper removed and the tube unloaded. The oxide layer is then stripped off revealing a diffused, damage-free surface.

10 Claims, 2 Drawing Figures

PROCESS AND APPARATUS FOR DIFFUSION OF SEMICONDUCTOR MATERIALS

BACKGROUND OF THE INVENTION

1. Field of the Invention materials and more particularly compounds The present invention is directed to the process and apparatus for the diffusion of semiconductor compounds to the diffusion of III–V semiconductor compounds in a semiclosed reusable tube.

2. Prior Art

According to prior techniques wafers of III–V semiconductor compounds such as GaAsP or GaP for use in fabricating light emitting diodes are diffused either by the closed tube method or an open tube method. In the case of closed tube diffusions both the dopant material and the wafers to be diffused are sealed with a dopant in an evacuated quartz ampoule which is then heated. This method has the advantage of yielding extremely uniform and reproducible results but has the disadvantage of requiring expensive and very time-consuming quartz work for each diffusion, together with the need to establish a very high vacuum.

There are two types of open tube diffusions. In one type the wafers are placed in an open tube and zinc as a dopant ffrom a from source is flowed down the tube. This diffusion is inexpensive and also hard to control for reproducible results and often results in surface damage, e.g., pitting. Moreover, a high flow rate is required to prevent oxygen from causing contamination and contributing to surface damage. In a second type of open tube diffusion the wafers are coated first with a densified oxide film and then with a zinc doped film and placed in an open furnace and diffused. The primary disadvantage of this technique is that the wafers must undergo the additional coating step and often do not exhibit uniform electrical properties.

SUMMARY OF THE INVENTION

The present invention provides a process and apparatus for the diffusion of semiconductor materials, particularly wafers of monocrystalline GaAsP, or GaP which overcome the aforementioned disadvantages of prior processes and apparatus but which provide reproducible results in an efficient and economical manner. Among the several objects of the invention may be noted the provision of such a process and apparatus which provide the economy and speed of open-tube diffusion processes and apparatus, but which substantially avoids wafer surface damage and oxygen contamination and the like, the provision of such process and apparatus which provide highly reproducible results and which obviate any need for additional protective coatings prior to application of a dopant coatings to the wafers; and the provision of such process and apparatus which provide doped semiconductor wafers for use in making LED's which wafers exhibit uniform electrical properties.

The present invention provides a reusable quartz ampoule which may be readily loaded and unloaded and in which an inert gas may be "sealed". The ampoule is provided with a removable stopper or a valve means for the introduction of an inert gas and pressure relief valve means.

The present invention utilizes a process for the diffusion of semiconductor materials wherein the semiconductor materials to be diffused and the diffusion source are placed in the quartz ampoule which is then "sealed" by the removable stopper. An inert gas (e.g., nitrogen) is introduced into the interior of the ampoule is placed in a furnace to complete the diffusion process. As the inert gas pressure increases during diffusion, the inert gas is vented through the relief valve.

The foregoing and other objects, features and advantages of the invention will be apparent from the following more particular description of a preferred embodiment of the invention as illustrated in the accompanying drawings.

DETAILED DESCRIPTION OF THE INVENTION

Figure 1:
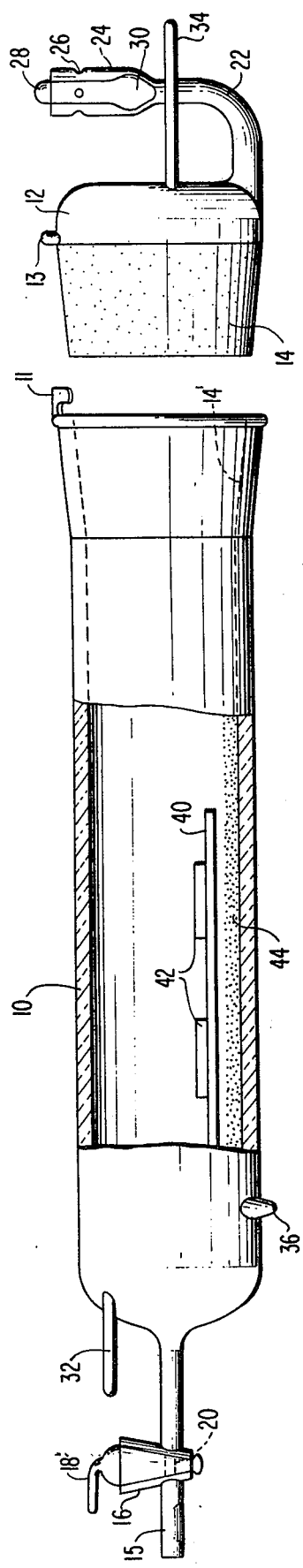
FIG. 1 is a side elevation, partly in section, showing the quartz ampoule and removable stopper according to the present invention.
Figure 2:
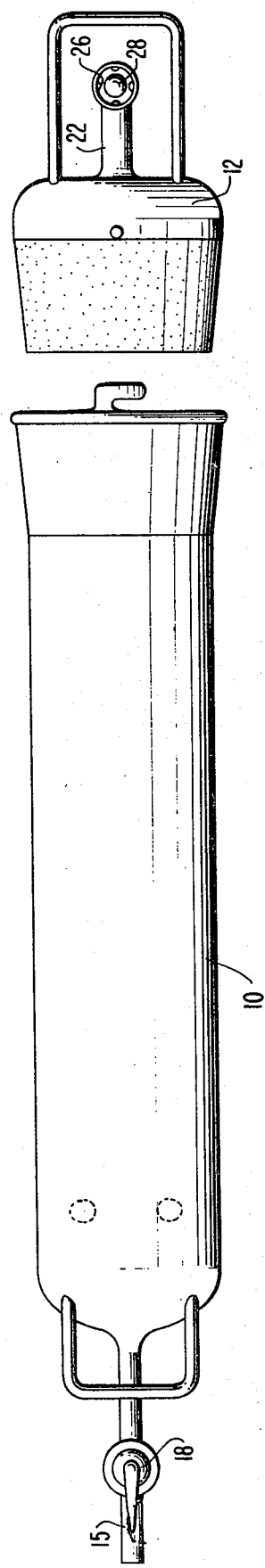
FIG. 2 is a top plan view of the ampoule and stopper as shown in FIG. 1.

A reusable quartz tube or ampoule 10 is provided with a stopper 12 having tapered portion 14 which is complementary to a similarly tapered portion 14' internally of the tube 10 adjacent to the open end thereof. The tapered surfaces may be ground to provide a tight fitting connection. The tube may be provided with tab 11 defining a slot for the reception of a pin 13 on the stopper to lock the stopper in its sealed position in the tube.

The opposite end of the tube 10 is provided with an extension 15 having an internal passage therein. The extension 15 is provided with a socket member 16 for the reception of a stopcock valve 18 having a transverse passage 20 therethrough. When the passage 20 is aligned with the passage in the extension 15 an inert gas from a suitable source (not shown) may be supplied to the interior of the tube 10. When the stopcock 18 is turned so that the passage 20 is transverse to the passage within the extension 14 this end of the tube 10 will be sealed.

The stopper is provided with an extension 22 having a passage therein and the free end of the extension 22 is at 24 for the reception of a valve member 28. The expanded portion 24 is provided with a plurality of dimples 26 in order to retain the enlarged end 30 of the valve member 28. The enlarged end 30 is normally disposed in sealing relation with the passage in the extension 22 and upon generation of excessive pressure within the ampoule when the stopper is in sealed relation therewith, the valve member 28 will be forced off its seat to reduce the pressure within the tube.

A pair of handles 32 and 34 may be provided on the tube 10 and the stopper 12 to aid in the insertion and removal of the ampoule with respect to a furnace. A pair of stabilizing feet 36 are provided on the bottom of the tube 10 to prevent the same from rolling when it is placed in a furnace. The entire assembly including the tube, stopper, stopcock, pressure relief valve, handles and feed may be made of quartz or any other suitable material in order to resist the high temperatures present in a furnace during a diffusion process.

In carrying out a diffusion process using the above-described quartz ampoule a suitable quartz boat 40 having a plurality of semiconductor wafers 42 thereon is inserted into the interior of the tube 10 along with a suitable supply of the diffusion source 44. The wafers are first prepared by depositing on them a thin layer of oxide for buffering the diffusion. The oxide may be deposited by chemical vapor deposition or applied by spinning silicafilm on the wafer. The stopper 12 is then inserted in sealing relation in the open end of the tube 10 and locked therein by means of the tab 11 and pin 13. A supply of an inert gaseous medium such as $N_2$ is then connected to the extension 14 then the stopcock 18 is turned to allow the passage of the gas through the passage 20 into the interior of the tube 10 to purge the same for a predetermined time. The excess gas is forced out through the pressure release valve 28 on the stopper 12. Thus, it will be seen that the inert gas enters the ampoule through valved passage 20, flows through the ampoule, and leaves through valve 28. After the interior of the tube has been purged with $N_2$ the source is disconnected from the extension 14, the stopcock 18 is turned to the closed position and the sealed ampoule is placed in a suitable furnace for a predetermined period of time in nitrogen at high temperature to accomplish the diffusion. When the term "sealed" is used it is understood that the degree of sealing achieved is modified by the presence of the pressure release valve and the accuracy of the complementary surfaces on the stopper, stopcock and tube. However, for all practical purposes the "sealed" ampoule maintains an inert gaseous atmosphere within the ampoule and does not permit air to enter the ampoule. After the diffusion takes place the ampoule may be removed to allow the tube to be unloaded and reloaded for a subsequent diffusion process.

The following examples illustrate the effectiveness of the diffusion process using the semi-sealed ampoule of the present invention providing results comparable to or more favorable than those obtained using an evacuated sealed ampoule for the diffusion process. In each of the examples the ampoule is thoroughly cleaned by standard techniques and based at 1000°C. for 30 minutes. The samples, which in this case are slices of GaAsP, are also cleaned using standard detergent procedure using detergent sold under the trade name "TRITON". Also during each of the following examples the semi-sealed ampoule is purged with nitrogen prior to being loaded into a tube which in turn in placed in a furnace. During the diffusion process nitrogen is also supplied to the tube at the rate indicated in each example. By silicafilm is meant a spin-on oxide available from Emulsitone Company, Milburn, N.J.

EXAMPLE 1

Silicafilm was spun on two wafers of GaAsP at 6000 rpm and densified for 60 seconds at about 250° C. All of the wafers were then loaded onto a boat in uniform proximity to a zinc source (0.5 g $NaAs_2$). The purged ampoule was placed in a tube within the furnace and diffused for 4 hours at 650° C. with $N_2$ being supplied in excess of 4000 cc/min. The ampoule was then quenched by conventional wet towel techniques immediately following the diffusion. Thereafter, the wafers were cleaned for 2 minutes in HCl and the oxides were removed by placing the wafers in a 10% solution of HF for 3 minutes. Both slices had good surfaces and a junction depth of 1 $\mu$. The surface of one initially coated wafer was slightly pitted but the surface of another wafer of the same size which was initially uncoated had been well attacked.

EXAMPLE 2

Four wafers of GaAsP were selected and two of them were then coated with silicafilm at 6000 rpm and densified for 60 seconds at about 250°C. The wafers were loaded into the ampoule with 0.3 g of $ZnAs_2$ with the coated wafers nearest the Zn source and the ampoule purged. Diffusion was carried out for 4 hours at 650° C. with $N_2$ being supplied at 4000 cc/min. The wafers were cleaned for 2 minutes in HCl, oxides being removed. The surfaces of three of the wafers had a good appearance. One of the initially-uncoated wafers had noticeable surface damage. The value of $R_s$ was equal to 22.5 ohms/square for the two uncoated wafers and 56 ohms/square for the coated wafers.

EXAMPLE 3

Four wafers of GaAsP were selected and silicafilm was spun on two wafers at 6000 rpm and densified for 60 seconds at about 260° C. All wafers were loaded on a boat such that the wafers were standing up on edge with backs facing the zinc source (0.3 g of $ZnAs_2$). Diffusion was carried out for 4 hours at 650° C. with $N_2$ being supplied at 4000 cc/min. After removing and cleaning the wafers all of their surfaces looked good except for some areas of the one uncoated wafer. These areas appeared to have a brownish color although performance did not seem to be effected when probed. One initially-coated wafer would barely light up with the probe at 10 ma. The value of $R_s$ for the initially-uncoated wafers was 21 ohms/square and greater than 300 ohms/square for the coated wafers.

EXAMPLE 4

Four wafers of GaAsP were selected and silicafilm was applied to two wafers spinning at 6000 rpm. The coating was densified for 60 seconds at approximately 250° C. A zinc source (0.5 g of $ZnAs_2$) was spread on the bottom of the ampoule and the wafers were stood up facing the front of the ampoule. Diffusion was carried out at 650° C. for 2 hours with $N_2$ being supplied at the rate of 4000 cc/min. The wafers were then cleaned in HCl for 2 minutes and the oxides were stripped from the slices. The surfaces of the uncoated wafers were well pitted but the surfaces of the coated wafers were good. $R_s$ of the uncoated wafers was 25 ohms/square and $R_s$ of the coated wafers was 75 ohms/square. The two coated wafers had a junction depth of 0.8 $\mu$ and a brightness B/J at 10 A/cm$^2$ of 71 and 82 respectively. The uncoated wafers had a junction depth 1 $\mu$ and a brightness B/J at 10 A/cm$^2$ of 66 and 69 respectively.

EXAMPLE 5

Silicafilm was applied by spinning at 6000 rpm to two of four GaAsP wafers. The coating was then densified for 60 seconds at about 250° C. The wafers were loaded into the ampoule with 0.5 g of $ZnAs_2$ spread along the bottom. The ampoule was then purged as in previous examples with N and placed in diffusion furnace. Diffusion was carried out at 650° C. for 4 hours with $N_2$ being supplied to the diffusion furnace as before at the rate of 4000 cc/min. It should here be noted that supplying nitrogen to the diffusion furnace in this way provides an inert environment around the ampoule which further ensures against contamination. After cleaning the wafers in HCl and stripping the oxides the initially-coated wafers looked good but the initially-uncoated wafers were well pitted. $R_s$ of the uncoated wafers was 18 ohms/square and the $R_s$ of the coated wafers was 55 ohms/square. One coated wafer had a junction depth of 1 $\mu$ and a brightness B/J at 10 A/cm$^2$ of 111. The other coated wafer had a junction depth of 1.5 μ and a brightness B/J at 10 A/cm² of 128. An uncoated wafer had a junction depth of 2 μ and a brightness B/J at 10 A/cm² of 88.

EXAMPLE 6

Four GaAsP wafers were selected, each from a different source, and silicafilm was spun on to all wafers at 6000 rpm and densified for 60 seconds at about 250°C. The wafers were loaded into the boat standing up and facing the front. The boat was placed in the ampoule along with 0.5 g of ZnAs₂ which was spread along the bottom of the boat. The ampoule was purged as before with N₂. Diffusion as carried out at 700° C. for 4 hours with N₂ being supplied to the diffusion furnace at the rate of 4000 cc/min. After diffusion the wafers were cleaned in HCl for 2 minutes and the oxides were stripped and the wafers cleaned. The surfaces of all wafers appeared good. The wafers had values of $R_s$ ranging from 31 to 36 ohms/square. Four other wafers from the same four sources were also diffused by the standard closed tube diffusion process. The comparative brightness with respect to junction depth is set forth in the following table.

| Sample GaAsP | Surface Coating | Diffused Surface | Junct. Depth | Brightness B/J at 10A/cm² Semi-sealed | Brightness B/J at 10A/cm² Closed Tube |
|---|---|---|---|---|---|
| Source No. 1 | SiO₂ | Smooth | 1.9μ | 92 | 74. |
| Source No. 2 | SiO₂ | Smooth | 2 | 118 | 70 |
| Source No. 3 | SiO₂ | Smooth | 1.7 | 88 | 60 |
| Source No. 4 | SiO₂ | Smooth | 1.2 | 82 | 60 |

EXAMPLE 7

Seven slices of GaAsP from seven different sources were selected and silicafilm was applied to four of the wafers by spinning at 6000 rpm. The coating was densified for about 60 seconds at approximately 250°C. The wafers were placed in the semi-sealed ampoule along with 0.5 g of ZnAs₂ spread inside the ampoule. The ampoule was purged with N₂. Diffusion was carried out at 650°C. for 3 hours with N₂ being supplied at the rate of 4000 cc/min. The surfaces of the coated wafers looked clean but the others were fairly heavily damaged. The uncoated wafers had a value of $R_s$ of .21 ohms/square and the coated surfaces had a value of $R_s$ of 66 ohms/square. Seven identical wafers were also prepared from the same seven sources and diffusion by the standard closed tube process. The comparative results are set forth in the following table.

| Sample GaAsP | Surface Coating | Diffused Surface | Junct. Depth | Brightness B/J at 10A/cm Semi-sealed | Brightness B/J at 10A/cm Closed tube |
|---|---|---|---|---|---|
| Source No. 1 | SiO₂ | Smooth | 1μ | 79 | 58 |
| Source No. 2 | None | Rough | 1.5 | 45 | 58 |
| Source No. 3 | SiO₂ | Smooth | 1 | 155 | 89 |
| Source No. 4 | None | Rough | 1.5 | 112 | 89 |
| Source No. 5 | SiO₂ | Smooth | 1 | 97 | 51 |
| Source No. 6 | None | Rough | 1.5 | 91 | 69 |
| Source No. 7 | SiO₂ | Smooth | 1 | 139 | 70 |

EXAMPLE 8

Two wafers having the nominal composition $GaAs_{0.6}P_{0.4}$, one unmasked, the other having a nitride diffusion mask applied thereto, were placed in a conventional chemical vapor despoition reactor for two minutes to deposit on them an SiO₂ layer of about 600A. thickness. The wafers were then loaded into the ampoule with 1.0 g of ZnAs₂. The ampoule was purged with N₂ for 5 minutes. Diffusion was carried out for 30 minutes at 825° C. with N₂ being supplied to the diffusion furnace. The ampoule was then conventionally towel-quenched. The coating was then stripped by placing the wafers for 90 seconds in HCl. The wafers were then rinsed and conventionally soap-cleaned. The wafers exhibited good surfaces and had a junction depth of 2 μ.

In view of the foregoing comparison of light emitting diodes manufactured according to the prior art closed tube process and the semi-sealed tube process of the present invention, it is clear that the present process provides comparable, or more favorable results, than the prior art closed tube process. As pointed out previously, it is possible to reuse the quartz tube a large number of times which results in a substantial savings over the prior art closed tube process which requires that the sealed or closed tube had to be broken open after each diffusion. Various modifications of the present apparatus and process are possible within the scope of the present invention. For example, various other type of valve constructions could be utilized in lieu of the inlet valve and the pressure relief valve disclosed in the present application and other forms of locking means could be used to hold the stopper in closed position in the tube. Moreover, III-V compound semiconductors of various compositions other than GaAsP and GaP may be processed in accordance with the present disclosure.

While the invention has been particularly shown and described with reference to the preferred embodiments thereof, it will be understood by those in the art that various other changes in form and details may be made therein without departing from the spirit and scope of the invention. Hence, the claims are intended to be interpreted as illustrative rather than in a limiting sense.

The embodiments of the invention in which an exclusive property or privilege is claimed are:

1. A process for introducing dopants by diffusion into semiconductor materials, said process comprising placing semiconductor material in an ampoule with a dopant source, closing said ampoule, sealing the ampoule but providing a pressure relief valve for the ampoule at one end thereof, purging the interior of the ampoule by admitting an inert gas to the ampoule through a valved passage at the opposite end of said ampoule and causing said inert gas to flow through said ampoule and out said relief valve, and heating the ampoule for a predetermined period of time to diffuse the dopant into semiconductor material, permitting gas pressure within said ampoule to be vented from said ampoule through said relief valve during diffusion while substantially preventing gas from entering said ampoule, said heating the ampoule being carried out in a diffusion furnace while supplying an inert gas to the diffusion furnace so as to surround said ampoule by the inert gas supplied to the diffusion furnace.

2. A process as set forth in claim 1 wherein said semiconductor material is constituted by at least one wafer, said process further comprising the step of first coating said wafer with an oxide layer, and said process including the step of stripping said oxide layer following diffusion.

3. A process as set forth in claim 2 wherein said oxide layer is constituted by $SiO_2$.

4. A process as set forth in claim 3 wherein said $SiO_2$ is deposited by chemical vapor deposition.

5. A process as set forth in claim 3 wherein said $SiO_2$ is deposited by spinning silicafilm onto said wafer, 6. A process as set forth in claim 2 wherein said heating the ampoule is carried out in a diffusion furnace and further comprising the step of supplying an inert gas to the diffusion furnace so as to surround said ampoule by the inert gas supplied to the diffusion furnace.

7. A process as set forth in claim 6 wherein said semiconductor material is a III-V compound semiconductor.

8. A process as set forth in claim 7 wherein said III-V compound semiconductor is GaAsP or GaP.

9. A process as set forth in claim 7 wherein said dopant source is a zinc source.

10. A process as set forth in claim 9 wherein said zinc source is $ZnAs_2$.

* * * * *